United States Patent
Farnworth

(10) Patent No.: US 7,829,385 B2
(45) Date of Patent: Nov. 9, 2010

(54) TAPED SEMICONDUCTOR DEVICE AND METHOD OF MANUFACTURE

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 11/492,764

(22) Filed: Jul. 26, 2006

(65) Prior Publication Data

US 2006/0267196 A1 Nov. 30, 2006

Related U.S. Application Data

(63) Continuation of application No. 09/118,080, filed on Jul. 17, 1998, now abandoned.

(51) Int. Cl.
*H01L 21/00* (2006.01)
*H01L 23/04* (2006.01)

(52) U.S. Cl. .............. 438/119; 438/612; 257/698; 257/783; 257/786

(58) Field of Classification Search ............... None
See application file for complete search history.

(56) References Cited

U.S. PATENT DOCUMENTS

| | | | |
|---|---|---|---|
| 4,769,744 A | 9/1988 | Neugebauer et al. | |
| 4,811,081 A | 3/1989 | Lyden | |
| 4,906,314 A | 3/1990 | Farnworth et al. | |
| 5,001,542 A | 3/1991 | Tsukagoshi et al. | |
| 5,148,265 A | 9/1992 | Khandros et al. | |
| 5,148,266 A | 9/1992 | Khandros et al. | |
| 5,218,168 A | 6/1993 | Mitchell et al. | |
| 5,258,330 A | 11/1993 | Khandros et al. | |
| 5,346,861 A | 9/1994 | Khandros et al. | |
| 5,391,918 A | 2/1995 | Koyanagi et al. | |
| 5,479,703 A * | 1/1996 | Desai et al. | ............ 29/852 |
| 5,559,055 A | 9/1996 | Chang et al. | |
| 5,731,231 A | 3/1998 | Miyajima | |
| 5,858,815 A | 1/1999 | Heo et al. | |
| 5,950,070 A | 9/1999 | Razon et al. | |
| 6,121,688 A | 9/2000 | Akagawa | |
| 6,221,691 B1 | 4/2001 | Schrock | |

(Continued)

FOREIGN PATENT DOCUMENTS

JP        62-249459        10/1987

(Continued)

OTHER PUBLICATIONS

L Platform SMT Printers For The Real World Brochure.

(Continued)

*Primary Examiner*—Alonzo Chambliss
(74) *Attorney, Agent, or Firm*—Dickstein Shapiro LLP

(57) ABSTRACT

Printed tape is used to form a leads on chip (LOC) ball grid array (BGA) semiconductor device. Leads for a plurality of devices may be applied simultaneously. Bond wires, glob top encapsulant, and the ball grid arrays for the devices may be formed in single process steps. A low temperature curing adhesive material may be used to reduce the effects of differential thermal expansion between the tape and surface of the wafer. In another embodiment of the invention, anisotropically conductive adhesive material is used to connect bond pads on a wafer to leads printed on a tape.

20 Claims, 5 Drawing Sheets

U.S. PATENT DOCUMENTS

2001/0052647 A1 * 12/2001 Plepys et al. ............... 257/738

FOREIGN PATENT DOCUMENTS

JP          63-306646       12/1988

OTHER PUBLICATIONS

DEK 265 Next Generation High Performance Surface Mount Screen Print Brochure.
Technical Data Sheet: Master Bond Polymer System EP 31.
Master Bond Problem Solver Brochure.
Dek Brochure.

* cited by examiner

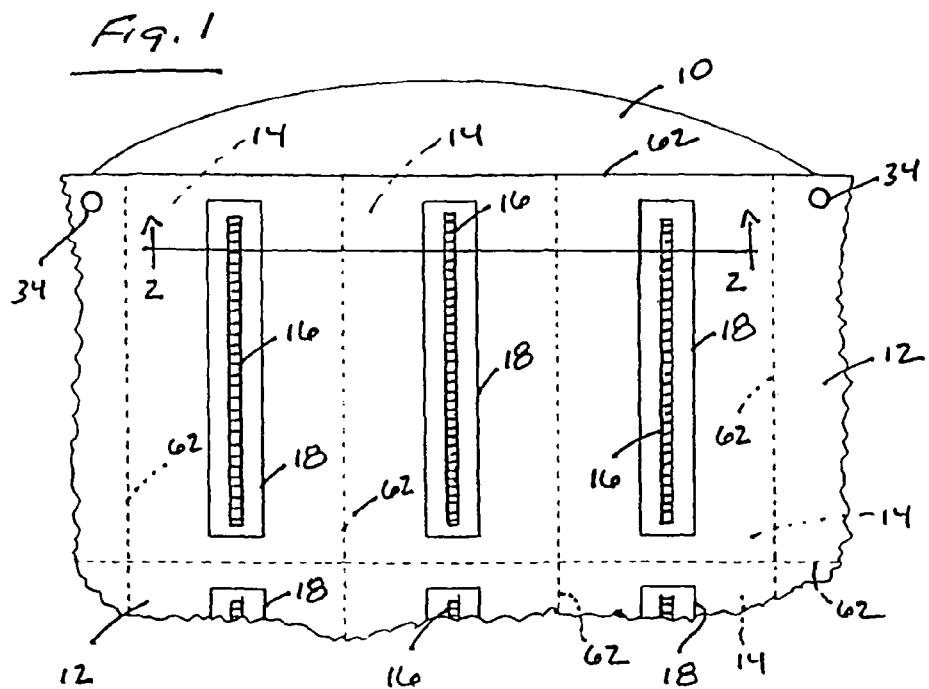
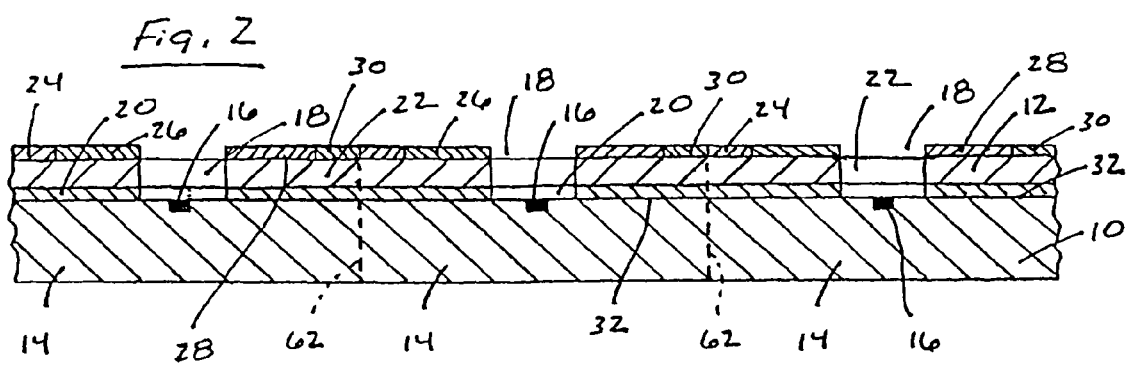

TAPED SEMICONDUCTOR DEVICE AND METHOD OF MANUFACTURE

This is a continuation application of U.S. patent application Ser. No. 09/118,080, filed on Jul. 17, 1998, now abandoned, the entire disclosure of which is incorporated by reference herein in its entirety.

BACKGROUND OF THE INVENTION

1. Field of the Invention

The present invention relates generally to taped semiconductor devices. The invention also relates to methods of making taped semiconductor devices. More particularly, the invention relates to a method of making leads on chip (LOC) semiconductor devices with ball grid arrays (BGA).

2. Discussion of the Related Art

A known LOC device is shown in U.S. Pat. No. 5,391,918 (Koyanagi et al.). The Koyanagi device has leads located above a semiconductor chip. The leads are separated from the chip by an insulating layer. The leads are connected by wires to bond pads in the center of the chip. The chip, the leads and the wires are encapsulated in a resin package.

The Koyanagi device has a number of disadvantages. One disadvantage is that the leads can be formed on only one chip at a time. To produce the Koyanagi device, the chip must be singulated from a wafer before the leads are formed. There is a need in the art for an improved method of forming leads on unsingulated chips.

Another disadvantage with the Koyanagi device is that the leads extend laterally beyond the side edges of the chip. The lateral dimensions of the leads are substantially greater than those of the chip. Consequently, the Koyanagi device cannot make efficient use of all of the available space on a printed circuit board.

U.S. Pat. No. 5,218,168 (Mitchell et al.) describes a semiconductor device with metal leads formed in a polyimide film. Solder beads connect the leads to respective die circuits and a lead frame. The beads extend through via holes in the polyimide film. A disadvantage with the Mitchell device is that the leads are not applied to the die circuits until after the circuits are diced out of a wafer. The leads are applied separately to singulated semiconductor chips.

Another disadvantage with the Mitchell device is that the lead frame extends beyond the side edges of the chip. Consequently, the area occupied by the finished device is substantially greater than the area available for circuitry on the chip. Since the periphery of the chip is inside the ends of the leads, the Mitchell device cannot fully utilize space on a printed circuit board.

Another disadvantage with the Mitchell device is that high temperature is used to adhere the polyimide film to the semiconductor chip. The high temperature may cause the film and the chip to expand at different rates, which causes misalignment problems.

SUMMARY OF THE INVENTION

The disadvantages of the prior art are overcome to a great extent by the present invention. In one aspect of the invention, a multi-layer tape is applied to a semiconductor wafer, before the wafer is diced into chips. The tape has a slot-shaped opening for each chip in the wafer. Electrically conductive leads are printed on the tape. Bond wires extend through the openings and connect the chips to the leads. The wires are glob top encapsulated in resin, and ball grid arrays are deposited on the leads. The ball grid arrays are located above the chips, within the respective peripheries of the chips.

In another aspect of the invention, the tape has a dielectric layer, and an adhesive layer is used to connect the dielectric layer to the wafer. Preferably, the adhesive layer is formed of low temperature curing adhesive material. In a preferred embodiment, the adhesive material achieves ninety percent of its maximum strength in less than about thirty six hours at seventy five degrees Fahrenheit. Consequently, it can be cured at room temperature. The low temperature curing adhesive material avoids misalignment problems that would be caused by a heat activated adhesive.

The adhesive layer may be stenciled onto the wafer before the tape is applied. Alternatively, the adhesive layer is applied to the tape first, and then the adhesive/tape matrix is applied to the wafer. In either event, the tape may be accurately adhered to multiple chips in a single alignment step.

The present invention also relates to a method of making semiconductor devices. The method employs a tape having a dielectric layer and electrically conductive leads. The tape may be stored on a roll. The tape is adhered to the wafer at room temperature to avoid alignment problems caused by differential thermal expansion. Bond wires are formed to connect the integrated circuits on the wafer to the electrically conductive leads.

In another aspect of the invention, the ball grid arrays are formed on the leads before the circuits are diced out of the wafer. This has the advantage of providing solder balls on a large number of devices at the same time. All of the balls may be formed during a single processing step. In addition, by locating the balls on the leads, inside the periphery of the respective chip, the lateral dimensions of the completed device are no larger than those of the chip. Consequently, space utilization on a printed circuit board is improved. In other words, the amount of chip circuitry and/or memory can be increased per unit area of occupied printed circuit board.

The individual chips may be separated from the wafer by dicing or sawing. During the singulation process, the tape provides mechanical protection for the integrated circuits, and the glob top resin protects the bond wires and the connections at the ends of the bond wires.

In an alternative embodiment of the invention, anisotropically conductive adhesive material is used to form a taped device. In this embodiment, bond wires are replaced by metal located in via holes in the dielectric layer. The anisotropically conductive adhesive material provides electrical connections between the via holes and the bond pads on the chip. The metal in the via holes is integrally connected to leads printed on the tape. A ball grid array is formed on the leads.

These and other features and advantages of the invention will become apparent from the following detailed description of preferred embodiments of the invention.

BRIEF DESCRIPTION OF THE DRAWINGS

FIG. 1 is a partial plan view of a taped wafer constructed in accordance with the invention.

FIG. 2 is a partial cross sectional view of the taped wafer of FIG. 1, taken along the line 2-2.

DETAILED DESCRIPTION OF PREFERRED EMBODIMENTS

Figure 3:
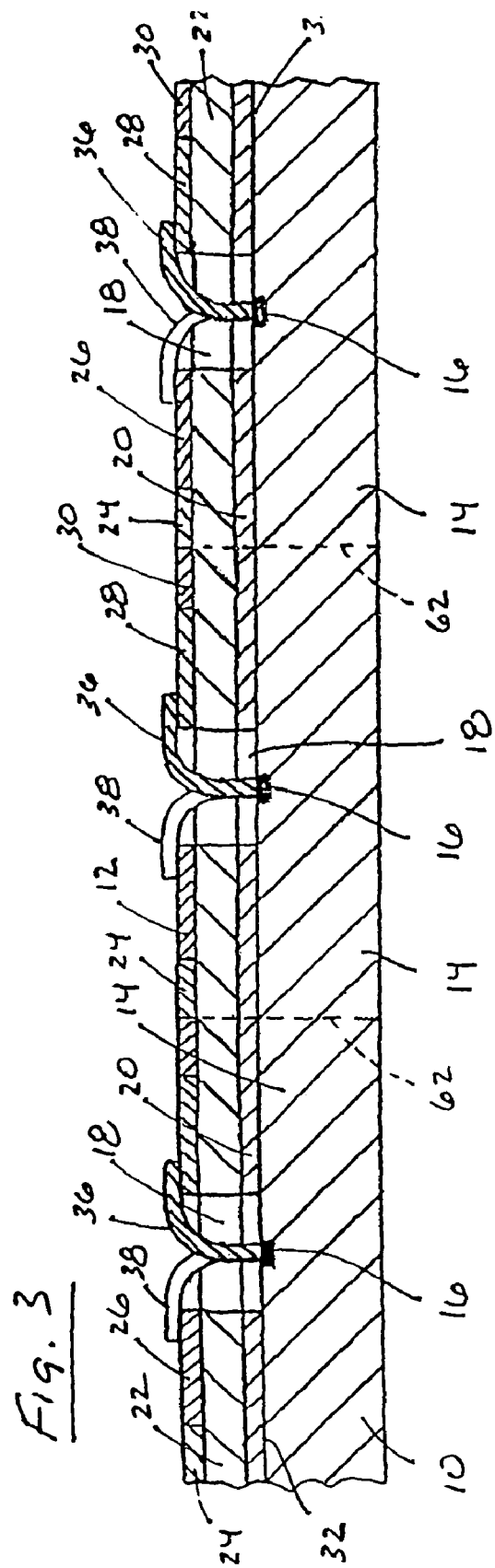
FIG. 3 is a partial cross section view, like FIG. 2, showing partially constructed semiconductor devices.

Referring now to the drawings, where like reference numerals designate like elements, there is shown in FIG. 1 a semiconductor wafer 10 covered by a printed tape 12. Semiconductor chips 14 are formed in the wafer 10. The wafer 10 is almost entirely covered by the tape 12. Each chip 14 has integrated circuits (not shown) and aligned bond pads 16. The bond pads 16 are electrically connected to the integrated circuits. The tape 12 has slot-shaped openings 18 for exposing the bond pads 16. The tape 12 also has an adhesive layer 20 (FIG. 2), a dielectric layer 22, and leads 24-30. (For clarity of illustration, the leads 24-30 are not shown in FIG. 1.) The openings 18 extend through the adhesive layer 20 (FIG. 2) and the dielectric layer 22.

The adhesive layer 20 may be formed of a low temperature curing material. For example, the adhesive layer 20 may be formed of a two component, room temperature curing epoxy adhesive marketed as Master Bond Polymer System EP31 by Master Bond Inc., of Hackensack, N.J. Preferably, the adhesive material cures to ninety percent of its maximum strength within twenty four to thirty six hours at about seventy five degrees Fahrenheit, and to ninety percent of its maximum strength within two to three hours at about one hundred fifty degrees Fahrenheit. The preferred material exhibits low curing shrinkage and reduced stress on the wafer surface 32. Silicone may be added to the adhesive material as a stress relieving agent if desired.

In the illustrated embodiment, the adhesive layer 20 is supplied with the other layers of the tape 12. That is, the adhesive layer 20 is applied to the dielectric layer 22 before the openings 18 are punched through the tape 12. If the adhesive layer 20 is tacky, a backing layer (not shown) may be provided to facilitate handling and storage. In another embodiment of the invention, the adhesive layer 20 is first stenciled onto the wafer surface 32 (without covering the bond pads 16), and then the tape 12 (the dielectric layer 22 and the leads 24-30) is applied onto the adhesive layer 20.

The dielectric layer 22 performs several functions. The dielectric layer 22 provides electrical insulation between the leads 24-30 and the integrated circuits. In addition, the dielectric layer 22 provides mechanical and alpha particle protection for the integrated circuits. In addition, the dielectric layer 22 provides mechanical support for the leads 24-30, before and after the tape 12 is applied to the wafer 10.

In a preferred embodiment of the invention, the dielectric layer 22 includes a layer of polyimide and/or a layer of benzocylobutene (BCB). Polyimide is preferred because it is relatively inexpensive and because it provides protection against alpha particle radiation. Polyimide is a hydrophilic material with high temperature resistance and a high coefficient of thermal expansion. BCB has a high dielectric constant, but it is not as temperature resistant as polyimide. Other materials may be used in the dielectric layer 22, if desired. For example, the dielectric layer 22 may include a layer of KOVAR alloy coated with a suitable polymer, such as polyimide and/or BCB. The polymer material in the dielectric layer 22 is cured before the tape 12 is applied to the wafer 10.

The metal leads 24-30 are preferably formed on the dielectric layer 22, before the tape 12 is applied to the wafer 10.

In operation, the tape 12 is aligned with respect to the wafer 10. The tape 12 is aligned such that the openings 18 are centered over the bond pads 16. The tape 12 may have suitable retention and holding holes 34 (FIG. 1) for facilitating alignment with the wafer 10. All of the integrated circuits on the wafer 10 may be covered by the tape 12 simultaneously.

The adhesive layer 20 (FIG. 2) is cured at low temperature to bond the tape 12 to the wafer 10. A heat source is not required during the bonding step. Curing at low temperature avoids misalignment problems that would otherwise be caused by differential thermal expansion. Preferably, the tape 12 does not expand relative to the top surface 32 of the wafer 10 during the curing of the adhesive layer 20. Preferably, a dielectric material (such as a loaded polyimide) is selected to have a coefficient of thermal expansion which is substantially the same as that of the wafer 10.

Preferably, the adhesive layer 20 is cured to ninety percent of its maximum strength without exceeding one hundred fifty degrees Fahrenheit, even more preferably without exceeding one hundred degrees Fahrenheit. Even more preferably, the temperature of the adhesive layer 20 is maintained at or below room temperature (about seventy five degrees Fahrenheit) throughout the entire bonding process.

Referring now to FIG. 3, after the tape 12 is adhered to the wafer 10, fine bond wires 36, 38 are connected to the bond pads 16 and the leads 24-30. There is one bond wire 36, 38 for each bond pad 16 and printed lead 24-30. (Only two bond wires per chip can be seen in FIG. 3. The other wires are hidden from view in FIG. 3; they are located behind the illustrated bond wires.) Preferably, all of the bond wires 36, 38 for the entire wafer 10 are formed during one processing step. The bond wires 36, 38 may be applied by a Palomar gantry wire bonding machine, for example, or by another suitable device. Suitable equipment may be obtained, for example, from Palomar Products, Inc. of Carlsbad, Calif.

Figure 4:
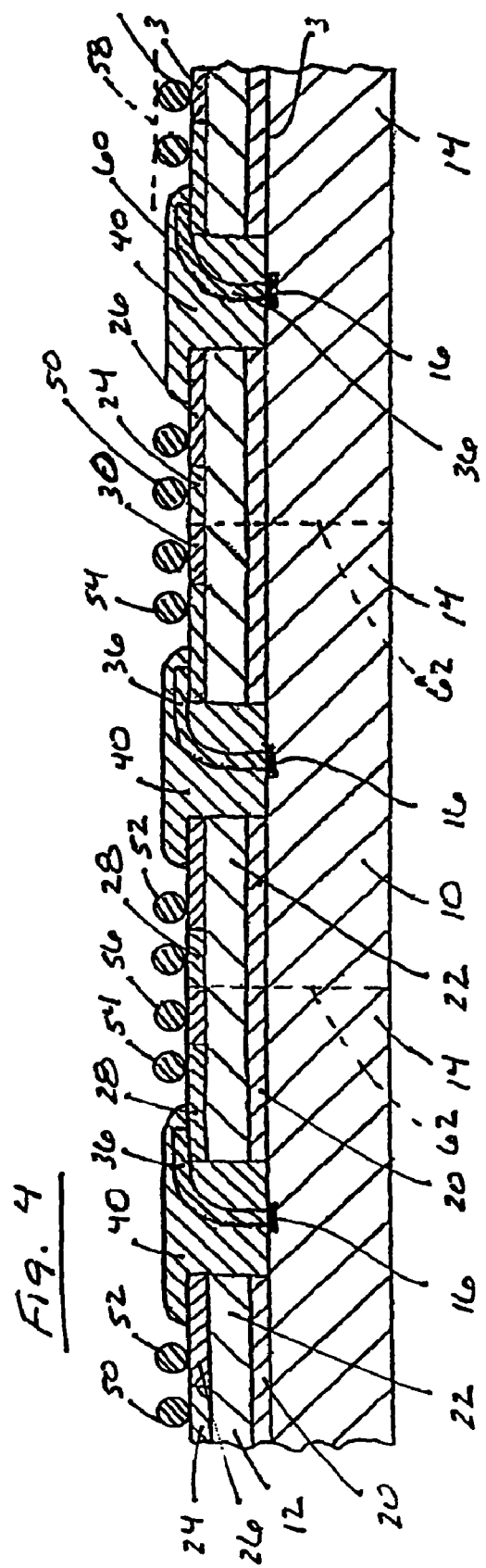
FIG. 4 is a partial cross sectional view, like FIG. 2, showing unsingulated semiconductor devices constructed in accordance with the present invention.
Figure 5:
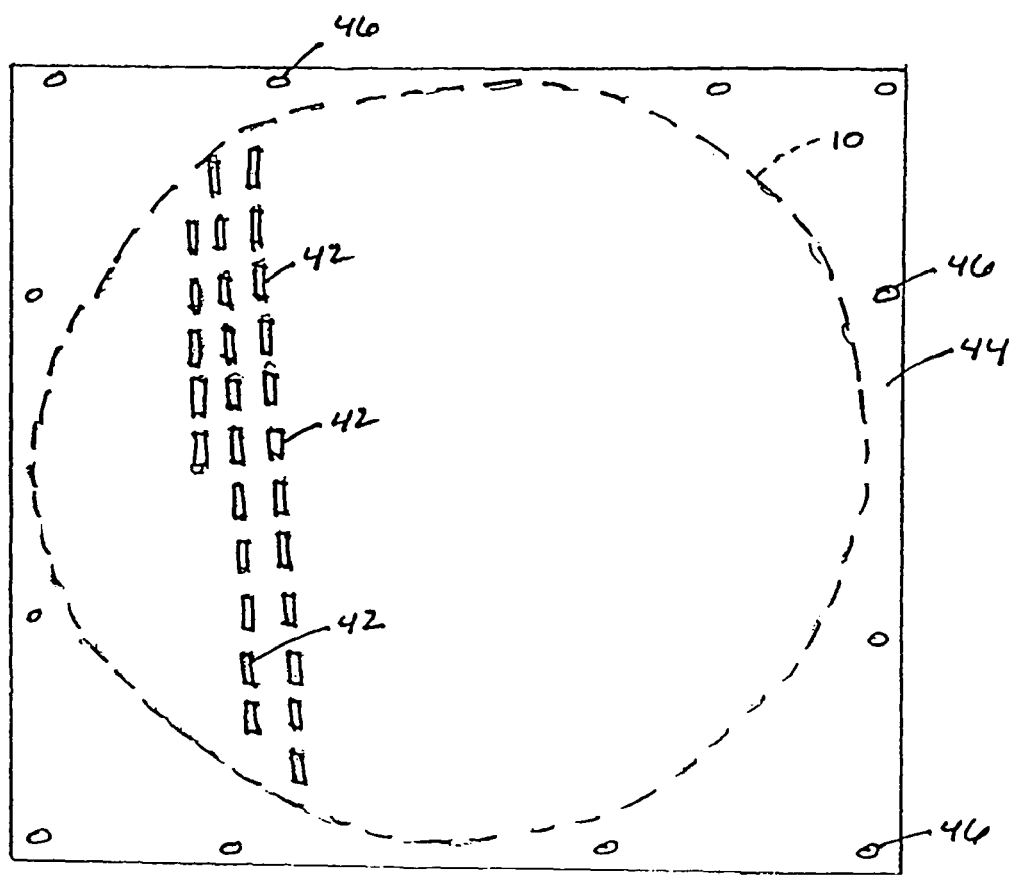
FIG. 5 is a plan view of a mask for dispensing glob top resin.

Then, the bond wires 36, 38, the bond pads 16, and the connections between the bond wires 36, 38 and the leads 24-30 are glob top encapsulated in a suitable resin material 40 (FIG. 4). The resin material 40 provides mechanical protection for the bond wires 36, 38. In addition, the resin material 40 may be hydrophobic to prevent moisture from reaching the bond wires 36, 38. The resin material 40 may be applied through openings 42 (FIG. 5) in a suitable mask 44. There should be one opening 42 for each chip 14 defined in the wafer 10. Retention and holding holes 46 may be provided for aligning the mask 44 with respect to the wafer 10.

Subsequently, minute solder balls 50-56 (FIG. 4) are applied on the respective leads 24-30 to form ball grid arrays (BGA). The balls 50-56 may be applied by a solder ball bumper process, a stencil process, or a preform process. Each ball 50-56 may have a diameter of about 0.325 millimeter. The balls 50-56 provide electrical connections from the leads 24-30 to an exterior device, such as a printed circuit board (not shown). In the illustrated embodiment, all of the balls 50-56 for the entire wafer 10 are applied to the leads 24-30 in a single process step.

The top surfaces 58 of the balls 50-56 should be higher than the top surfaces 60 of the glob top material 40. In the illustrated embodiment, the top surfaces 58 of the balls 50-56 are at least ten mils higher than the top surfaces 60 of the resin material 40. This way, the balls 50-56 are accessible for connection to the exterior device.

Figure 6:
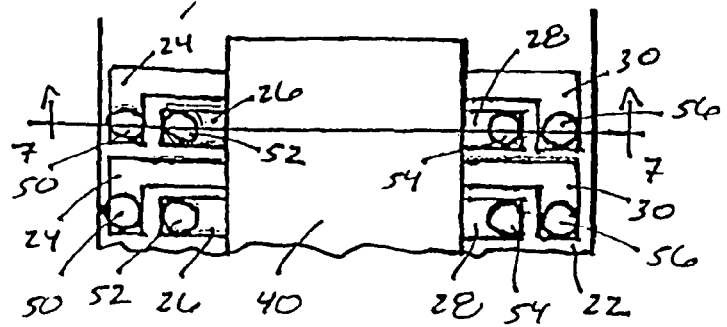
FIG. 6 is a partial plan view of a semiconductor device constructed in accordance with the invention.
Figure 7:
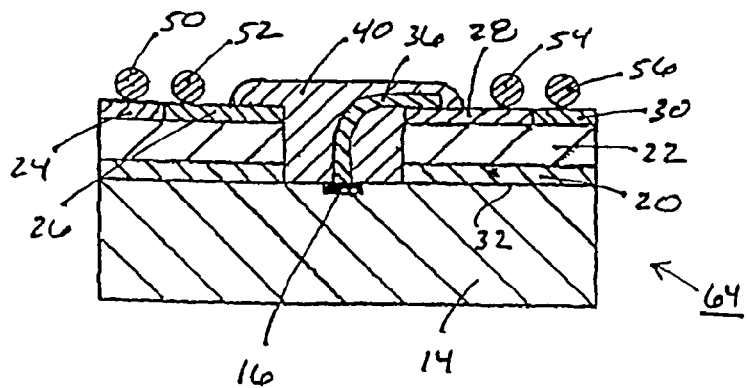
FIG. 7 is a cross section view of the device of FIG. 6, taken along the line 7-7.

The taped and glob topped wafer 10 shown in FIG. 4 is diced or sawed along singulation lines 62 to form individual semiconductor devices 64 (FIGS. 6 and 7). During the singulation process, the tape 12 provides mechanical protection for the wafer surface 32.

In an alternative embodiment of the invention, the wafer 10 may be subdivided into chip clusters (not shown) for certain manufacturing processes. For example, the wafer 10 may be subdivided into chip clusters prior to forming the wires 36, 38, or prior to forming the ball grid arrays 50-56. The entire wafer 10 does not necessarily have to remain in one piece throughout the entire process of manufacturing the semiconductor devices 64.

Figure 8:
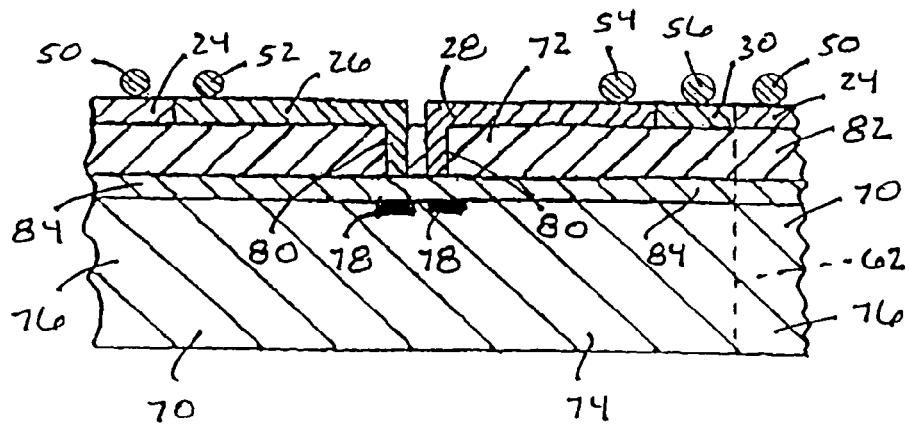
FIG. 8 is a partial cross section view of unsingulated semiconductor devices constructed in accordance with another embodiment of the invention.

FIG. 8 shows semiconductor devices 70 constructed in accordance with another embodiment of the invention. The devices 70 are formed by locating a printed tape 72 on a semiconductor wafer 74. Semiconductor chips 76 are formed in the wafer 74. The wafer 74 is covered by the tape 72. Each chip 76 has integrated circuits (not shown) and rows of bond pads 78. The bond pads 78 are electrically connected to the integrated circuits. The tape 72 has via holes 80 located above the bond pads 78. The via holes 80 are formed in a dielectric layer 82. Lads 24-30 are printed on the dielectric layer 82. The leads 24-30 are connected to metal deposited in the via holes 80. Ball grid arrays 50-56 are formed on the leads 24-30 for connection to a printed circuit board or the like.

An anisotropically conductive adhesive layer 84 is used to connect the tape 72 to the wafer 70. The adhesive layer 84 is an electrical conductor in the vertical direction (top to bottom as viewed in FIG. 8). The adhesive layer 84 is an electrical insulator in horizontal directions. Consequently, the adhesive layer 84 provides electrical connections between the metal in the via holes 80 and the wafer bond pads 78. The adhesive layer 84 otherwise may have the same characteristics and properties as those described above for the adhesive layer 20 shown in FIG. 7. Suitable anisotropically conductive adhesives for the embodiment shown in FIG. 7 are marketed by AI Technology of Princeton, N.J., and Zymet of East Hampton, N.J.

The dielectric layer 82 shown in FIG. 8 may have the same characteristics and properties as those of the dielectric layer 22 shown in FIG. 7.

The above descriptions and drawings are only illustrative of preferred embodiments which achieve the features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. A method of forming a semiconductor device, comprising:
   providing a semiconductor chip having electrical contacts;
   providing a dielectric layer over the semiconductor chip, the dielectric layer having openings corresponding to the electrical contacts; providing metal within the openings of the dielectric layer;
   providing electrically conductive leads on the dielectric layer;
   providing an adhesive material between the semiconductor chip and the dielectric layer such that the adhesive material electrically connects the electrical contacts to the leads; and
   curing the adhesive material to about ninety percent of its maximum strength, within two to three hours, without exceeding one hundred fifty degrees Fahrenheit so as to avoid misalignment between the semiconductor chip and the dielectric layer.

2. The method of claim 1, wherein the dielectric layer comprises polyimide.

3. The method of claim 2, further comprising providing solder balls over at least one of the electrically conductive leads.

4. The method of claim 3, wherein the solder balls are elevationally higher than the dielectric layer.

5. The method of claim 4, wherein the solder balls are at least 10 mils higher than the dielectric layer.

6. The method of claim 1, wherein the adhesive material electrically connects the bond pads to the leads by conducting electrical charge in a vertical direction while insulating electrical charge in a horizontal direction.

7. A method of forming a semiconductor device, comprising:
   providing a semiconductor chip having electrical contacts;
   providing a dielectric layer over the chip, the dielectric layer having openings corresponding to the electrical contacts;
   providing metal within the openings of the dielectric layer;
   providing an adhesive material between the semiconductor chip and the dielectric layer such that the adhesive material electrically connects the electrical contacts to the metal in the corresponding openings; and
   curing the adhesive material to about ninety percent of its maximum strength, within two to three hours, without exceeding one hundred fifty degrees Fahrenheit so as to avoid misalignment between the semiconductor chip and the dielectric layer.

8. The method of claim 7, wherein the dielectric layer comprises polyimide.

9. The method of claim 7, further comprising providing conductive leads on the dielectric layer electrically connected to the metal within the openings of the dielectric layer.

10. A method of forming a semiconductor device, comprising:
    providing a semiconductor chip;
    providing a dielectric layer over the semiconductor chip;
    providing an anisotropically conductive adhesive material located between the dielectric layer and the semiconductor chip; and
    curing the anisotropically conductive adhesive material to about ninety percent of its maximum strength, within two to three hours, without exceeding one hundred fifty degrees Fahrenheit so as to avoid misalignment between the dielectric layer and the chip.

11. The method according to claim 10, wherein the anisotropically conductive adhesive material is an electrical conductor in a vertical direction and an electrical insulator in a horizontal direction.

12. The method of claim 10, further comprising providing conductive leads on the dielectric layer.

13. The method of claim 12, further comprising providing bond wires connecting the semiconductor chip to the electrically conductive leads.

14. The method of claim 10, further comprising providing a resin material encapsulating the bond wires.

15. The method of claim 10, further comprising providing electrical contacts on the semiconductor chip and openings in the anisotropically conductive adhesive material corresponding to the electrical contacts.

16. The method of claim 15, further comprising providing openings in the dielectric layer corresponding to the electrical contacts.

17. A method of forming a semiconductor device, comprising:
    providing a semiconductor chip having electrical contacts;

providing a dielectric layer having leads and openings corresponding to the electrical contacts on the semiconductor chip, providing metal within the openings of the dielectric layer;

providing an adhesive material to adhere the semiconductor chip and the dielectric layer and to electrically connect the electrical contacts and the leads;

curing the adhesive material to about ninety percent of its maximum strength, within two to three hours, without exceeding one hundred fifty degrees Fahrenheit so as to avoid misalignment between the semiconductor chip and the dielectric layer; and forming solder balls on said electrically conductive leads to form at least one ball grid array.

18. The method of claim 17, wherein said solder balls are formed after curing said adhesive material.

19. The method of claim 17, further comprising depositing metal within the openings to electrically connect the leads to the adhesive material.

20. The method of claim 17, wherein the adhesive material is electrically conductive in a vertical direction, and electrically insulating in a horizontal direction.

* * * * *